United States Patent
Mariotti

(10) Patent No.: US 11,508,925 B2
(45) Date of Patent: Nov. 22, 2022

(54) PHOTOVOLTAIC DEVICE

(71) Applicant: University of Ulster, Coleraine (GB)

(72) Inventor: Davide Mariotti, Belfast (GB)

(73) Assignee: UNIVERSITY OF ULSTER, Coleraine (GB)

( * ) Notice: Subject to any disclaimer, the term of this patent is extended or adjusted under 35 U.S.C. 154(b) by 0 days.

(21) Appl. No.: 15/746,575

(22) PCT Filed: Jul. 18, 2016

(86) PCT No.: PCT/EP2016/067086
§ 371 (c)(1),
(2) Date: Jan. 22, 2018

(87) PCT Pub. No.: WO2017/016920
PCT Pub. Date: Feb. 2, 2017

(65) Prior Publication Data
US 2018/0212175 A1    Jul. 26, 2018

(30) Foreign Application Priority Data
Jul. 29, 2015 (GB) ...................... 1513366

(51) Int. Cl.
*H01L 51/42* (2006.01)
*H01L 31/0384* (2006.01)
(Continued)

(52) U.S. Cl.
CPC .... *H01L 51/4253* (2013.01); *H01L 31/03845* (2013.01); *H01L 31/035218* (2013.01);
(Continued)

(58) Field of Classification Search
CPC ....... H01L 31/035218; H01L 31/03845; H01L 51/4253; H01L 51/426
See application file for complete search history.

(56) References Cited

U.S. PATENT DOCUMENTS 9,391,287 B1 * 7/2016 Huang ............... H01L 51/4213
2005/0236556 A1   10/2005 Sargent et al.
(Continued)

FOREIGN PATENT DOCUMENTS

EP    2597695 A1    5/2013
KR    20110085216 A    7/2011
(Continued)

OTHER PUBLICATIONS

Ning, Z. et al. "Quantum-Dot-in-Perovskite Solids." Nature, vol. 523, pp. 324-341. Jul. 16, 2015 (Year: 2015).*
(Continued)

*Primary Examiner* — Herve-Louis Y Assouman
*Assistant Examiner* — Christopher M Roland
(74) *Attorney, Agent, or Firm* — Burns & Levinson LLP; Joseph P. Quinn; Marlo Schepper Grolnic

(57) ABSTRACT

A photovoltaic device (10) comprising a photoactive body between two electrodes (contact 1, contact 2). The body comprises semiconductor particles (24) embedded in a semiconductor matrix (22). The particles and matrix are electronically or optically coupled so that charge carriers generated in the particles are transferred directly or indirectly to the matrix. The matrix transports positive charge carriers to one of the electrodes and negative charge carriers to the other electrode. The particles are configured so that they do not form a charge carrier transport network to either of the electrodes and so perform the function of charge carrier generation but not charge carrier transport.

20 Claims, 2 Drawing Sheets

(51) Int. Cl.
*H01L 31/0352* (2006.01)
*H01L 51/00* (2006.01)
*B82Y 20/00* (2011.01)
*B82Y 30/00* (2011.01)

(52) U.S. Cl.
CPC ........ *H01L 51/0003* (2013.01); *H01L 51/426* (2013.01); *B82Y 20/00* (2013.01); *B82Y 30/00* (2013.01); *Y02E 10/549* (2013.01)

(56) References Cited

U.S. PATENT DOCUMENTS

| | | | |
|---|---|---|---|
| 2008/0017242 A1* | 1/2008 | Sinha | B82Y 10/00 |
| | | | 136/252 |
| 2008/0128021 A1 | 6/2008 | Choudhury et al. | |
| 2010/0051092 A1 | 3/2010 | Dumitru et al. | |
| 2010/0148144 A1* | 6/2010 | Britton | B82Y 10/00 |
| | | | 257/9 |
| 2012/0174969 A1* | 7/2012 | Murayama | H01L 51/426 |
| | | | 136/252 |
| 2013/0207070 A1 | 8/2013 | Quesnel | |
| 2015/0357591 A1* | 12/2015 | Karunadasa | H01L 51/4226 |
| | | | 136/256 |
| 2016/0079552 A1* | 3/2016 | Su | H01L 51/0032 |
| | | | 136/260 |
| 2016/0086739 A1* | 3/2016 | Burschka | C07F 15/065 |
| | | | 136/263 |
| 2016/0233439 A1* | 8/2016 | Burschka | H01L 51/0083 |
| 2016/0268510 A1* | 9/2016 | Moon | H01L 51/424 |
| 2016/0293342 A1* | 10/2016 | Yumoto | H01G 9/2031 |
| 2016/0380136 A1* | 12/2016 | Ning | C09K 11/02 |
| | | | 252/519.4 |
| 2017/0263686 A1* | 9/2017 | Beiley | H01L 27/307 |

FOREIGN PATENT DOCUMENTS

| | | |
|---|---|---|
| WO | 2007/124445 A2 | 11/2007 |
| WO | 2008/030922 A2 | 3/2008 |

OTHER PUBLICATIONS

Huynh, W. et al. "Hybrid Nanorod-Polymer Solar Cells." Science, vol. 295, pp. 2425-2427. Mar. 29, 2002. (Year: 2002).*
McDonald, S. et al. "Solution-Processed PbS Quantum Dot Infrared Photodetectors and Photovoltaics." Nature Materials, vol. 4, pp. 138-143. Feb. 2005. (Year: 2005).*
Great Britain Search Report for GB1513366.3 dated Feb. 3, 2016.
International Search Report for PCT/EP2016/067086 dated Oct. 19, 2016.
Franceschetti, A. et al. "Quantum-dot intermediate-band solar cells with inverted band alignment"; Physica E—Low-Dimensional Systems and Nanostructures; Elsevier Science BV, NL; Oct. 1, 2008; vol. 41; Nr 1; pp. 15 to 17.
Qi, D. et al. "Efficient polymer nanocrystal quantum dot photodetectors"; Applied Physics Letters; vol. 86, Nr 9; Feb. 23, 2005; pp. 93103 to 093103-3.
Khan, M. T. et al. "Growth of cadmium telluride nanocrystals in poly(3-hexylthiophene) matrix for photovoltaic application;" Journal of Applied Physics; Aug. 15, 2001; vol. 110; Nr 4; pp. 44509 to 44509-7.
Zaumseil, J. et al. "N-Type and Ambipolar Charge Transport in Polymer Field-Effect Transistors." Abstract submitted for Mar. 2005 Meeting of the American Physical Society, Dec. 6, 2004 (1 pg).

* cited by examiner

PHOTOVOLTAIC DEVICE

CROSS-REFERENCE TO RELATED APPLICATIONS

This application is a U.S. national stage application under 35 U.S.C. 371 of co-pending International Application No. PCT/EP2016/067086 filed on Jul. 18, 2016 and entitled PHOTOVOLTAIC DEVICE, which in turn claims priority to Great Britain Patent Application No. 1513366.3 filed on Jul. 29, 2015, the contents of which are incorporated by reference herein in their entirety for all purposes.

FIELD OF THE INVENTION

This invention relates to photovoltaic devices.

BACKGROUND TO THE INVENTION

Photovoltaic devices produce electrical energy from light energy, such as from the sun or other photon source using photoactive materials, typically semiconductor materials, that support the photovoltaic effect. The photovoltaic effect involves photons of light exciting electrons in a photoactive material into a higher state of energy, allowing them to act as charge carriers for an electric current.

Known photovoltaic devices are based on semiconductor junctions, either homojunctions or heterojunctions, formed at the interface of two semiconductors of the same material or different materials, respectively. In both cases, at equilibrium, the interface is intended to form a so-called type-II junction whereby conduction and valence band-edges of the two semiconductors align in a staggered configuration. One type of charge carrier is transported to one electrode by one of the semiconductors while the other type of charge carrier is transported to the other electrode by the other semiconductor. In such photovoltaic devices both semiconductor materials forming the junction are desired to possess good carrier transport properties in addition to good light absorption across the full solar spectrum, as well as a range of other properties such as longevity under environmental conditions and ultra-violet radiation. Furthermore in order to increase the conversion efficiency of devices, it is highly desirable to split the absorption range of different materials in complementary spectral regions so as to maximize the absorbed photon energy at different wavelengths. However it is often found that semiconductors cannot excel in all desired areas. For example if a semiconductor material exhibits good light absorption, it might exhibit poor transport properties (e.g. polymers). A particular case is for instance represented by quantum dots which have the potential of very efficient carrier generation, but need to be incorporated into a percolating network to facilitate the transport of charge carriers, which presents inherent challenges due to unavoidable interfaces between quantum dots.

It would be desirable to provide a photovoltaic device that overcomes or mitigates at least some of the problems outlined above.

SUMMARY OF THE INVENTION

The invention provides a photovoltaic device comprising: a first electrode; a second electrode; a photoactive body comprised of a first semiconductor material located between the first and second electrodes, said first semiconductor material being configured to transport positive charge carriers to one of said first and second electrodes and to transport negative charge carriers to the other of said first and second electrodes; and a plurality of particles of semiconductor material embedded in said first semiconductor material, the particles being responsive to the absorption of light to generate positive and negative charge carriers, wherein said particles are coupled to said first semiconductor material to cause said generated positive and negative charge carriers to transfer to said first semiconductor material, or to cause positive and negative charge carriers corresponding to said generated positive and negative charge carriers to be generated in said first semiconductor material.

Advantageously, said particles do not form a charge carrier transport network in said photoactive body to either of said first and second electrodes.

In preferred embodiments, said particles are spatially distributed in said first semiconductor material such that collectively said particles do not form a charge carrier transport network in said photoactive body to either of said first and second electrodes.

Preferably said particles are spatially distributed in said first semiconductor material such that collectively said particles do not prevent charge carriers in said first semiconductor material from being transported by said first semiconductor material to the respective electrode.

In some embodiments, said particles are electronically coupled to said first semiconductor material to allow direct transfer of said positive and negative charge carriers from the respective particle to the first semiconductor material. In such embodiments said particles may have a surface termination, for example a hydrogen terminated surface, that facilitates transfer of charge carriers from said particles to said first semiconductor material.

In other embodiments, said particles are optically coupled to said first semiconductor material whereby, in use, photons generated by recombination of positive and negative charge carriers in a respective particle are transmitted to and absorbed by said first semiconductor material to generate charge carriers in said first semiconductor material. In such embodiments, said particles have surface termination, for example an oxygen terminated surface, that prevents or at least impedes direct transfer of said positive and negative charge carriers from the respective particle to the first semiconductor material.

Optionally said particles have at least one surface monolayer. The particles may have at least one electrically insulating surface monolayer.

In typical embodiments, the first and second semiconductors are selected such that a type I heterojunction or type I homojunction is formed between said particles and said first semiconductor material.

Preferably, the first and second semiconductors are selected such that there is a nested, or straddled, bandgap alignment at the interface between the particles and the first semiconductor material, the bandgap of the first semiconductor preferably being smaller than and located within the bandgap of the respective particle.

In typical embodiments, said particles are nanoparticles, for example quantum dots.

Optionally, a selective contact layer, for example a hole transport layer or an electron transport later, is provided between said photoactive layer and either or both of said first and second electrodes.

Preferred embodiments of the invention mitigate at least some of the problems outlined above by interfacing a first semiconductor material, preferably having relatively good charge carrier transport properties, e.g. organometallic halide perovskites, with a second semiconductor material, e.g. quantum dots or other particulate form, advantageously in a type-I heterojunction configuration, wherein the first semiconductor material comprises a matrix in which the second semiconductor material is embedded. This arrangement allows de-coupling of charge carrier transport and charge carrier generation, whereby the second semiconductor material generates both positive and negative carriers, the generated carriers transferring (directly or indirectly depending on whether the first and second semiconductors are electronically or optically coupled) to the first semiconductor material, which is then responsible for transporting the charge carriers to one or other of the electrodes.

In preferred embodiments, the photovoltaic device comprises first and second semiconductors in type-I nested configuration and in an optically-coupling mode or electronically coupling mode.

Typically, the first and second semiconductors form a type-I junction with a nested (or straddling) band alignment, i.e. a band alignment in which one semiconductor has a larger bandgap than the other, the smaller bandgap being completely contained in the larger bandgap. In preferred embodiments, the first semiconductor (which is used to provide the matrix) has the smaller bandgap and the second semiconductor (which is embedded in the matrix) has the larger bandgap.

Advantageously, the second semiconductor material is particulate, preferably comprising semiconductor nanoparticles, e.g. quantum confined semiconductor nanoparticles, or quantum dots. Optionally, the nanoparticles, or quantum dots, are of a type that exhibits multiple charge carrier generation or multi-exciton generation.

Further advantageous aspects of the invention will be apparent to those ordinarily skilled in the art upon review of the following description of a specific embodiment and with reference to the accompanying drawings.

BRIEF DESCRIPTION OF THE DRAWINGS

An embodiment of the invention is now described by way of example and with reference to the accompanying drawing in which like numerals are used to denote like parts and in which.

DETAILED DESCRIPTION OF THE DRAWINGS

Figure 1:
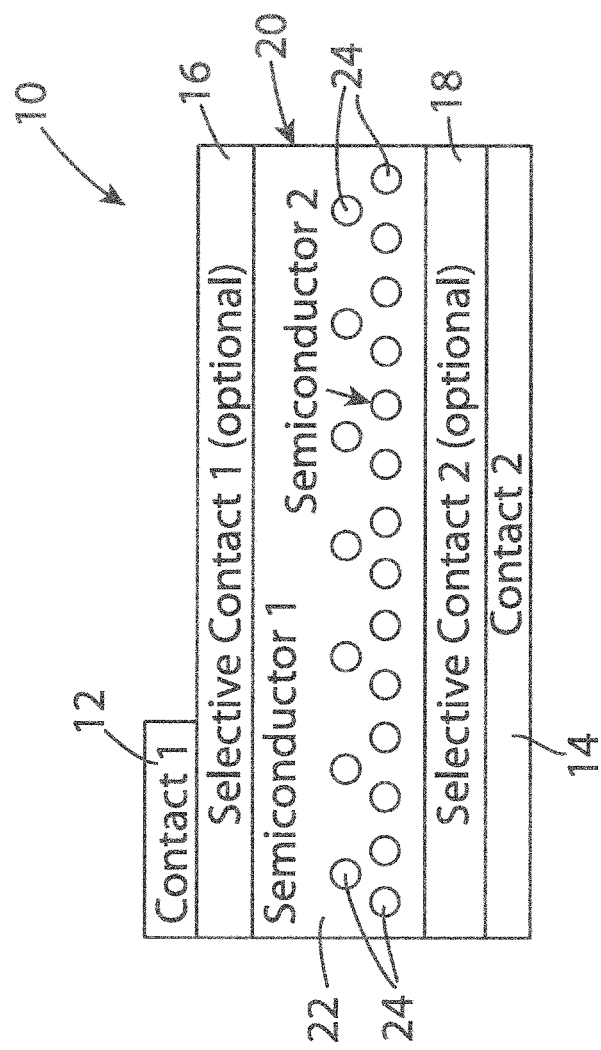
FIG. 1 is a schematic view of a photovoltaic device embodying the present invention.

Referring now to FIG. 1 of the drawings there is shown, generally indicated as 10, a photovoltaic device embodying the invention. The device 10 comprises first and second electrodes 12, 14 between which is provided a body 20 of photoactive material, typically comprising one or more semiconductor materials.

During operation of the photovoltaic device 10, photons are absorbed by the photoactive body 20 to generate charge carriers in the form of electron-hole pairs (not shown in FIG. 1), or excitons. The inherent electric field within the photoactive material separates the electron-hole pairs so electrons exit the photoactive material through one of the electrodes 12, 14, while holes exit the photoactive material through the other electrode 14, 12 (depending on the polarity of the device 10). This causes electric current to flow through the photovoltaic device 10. The device 10 may be incorporated into any conventional electrical circuit (not shown), e.g. connected to an electrical load or to other like devices, in order that the generated current may be used in any desired manner.

Optionally, a respective carrier selective contact 16, 18 is provided between the photoactive body 20 and a respective one of the electrodes 12, 14 to improve the extraction, or collection, of the respective charge carriers to the respective electrodes 12, 14. For the electrode to which electrons are transported, the carrier selective contact may be referred to as an electron transport layer (ETL) and may for example comprise a layer of titanium dioxide ($TiO_2$). For the electrode to which holes are transported, the carrier selective contact may be referred to as a hole transport layer (HTL) and may for example comprise a layer of molybdenum oxide, nickel oxide or spiro-MeOTAD. The electrodes 12, 14 are typically metallic, e.g. comprising gold, aluminium, silver or indium-tin dioxide, as is conventional.

The photoactive body 20 comprises a block or layer of a first semiconductor material 22 in which there is embedded particles 24 of a second semiconductor material. The first semiconductor material 22 may be said to provide a matrix in which the second semiconductor material 24 is embedded. Ideally, the particles 24 are embedded in the matrix such that they are separated from one another, i.e. individually surrounded by the embedding semiconductor material 22. It is preferred that the spatial distribution of the particles 24 is enough (i.e. sufficient spacing between at least some and preferable substantially all of the particles 24) to allow charge carriers to be transferred from the particles 24 to the matrix 22 and/or for re-emitted photons from the particles 24 to be absorbed by matrix 22. The spatial distribution of the particles 24 is also such that the particles 24 collectively do not form a charge transport network that can transport charge carriers to either of the electrodes 12, 14. This may be achieved by the inter-particle spatial separation and/or by any other conventional means e.g. providing the particles 24 with one or more electrically insulating outer layers. For example the particles 24 may be spaced sufficiently far apart and/or are sufficiently far from the or each electrode 12, 14 that collectively they do not provide a charge carrier transport network to the or each electrode 12, 14, i.e. that the particles 24 do not provide paths by which the charge carriers can be transported to the electrodes 12, 14. This may mean that at least some of particles 24 are far enough apart from each other to prevent or at least restrict electronic or charge coupling between particles 24. It will be understood however that some of the particles 24 may touch one another and/or be close enough to allow electronic coupling between particles 24, and this may for example depend on the nature of the manufacturing process used for the device 10. Nevertheless, in preferred embodiments the particles 24 are distributed in the matrix 22 to the extent that, collectively, charge carriers are not transported to either of the electrodes 12, 14 by the particles 24, i.e. the particles 24 do not form a percolating or other charge transport network capable of transporting charge carriers to either of the electrodes 12, 14. As a result, both types of photo-generated charge carriers (holes and electrons) are transported to the electrodes 12, 14 by the embedding semiconductor 22. This is in contrast to conventional photovoltaic devices in which the holes are transported by one semiconductor and the electrons are transported by another.

Charge carriers that are photo-generated in the particles 24 are transferred directly or indirectly to the embedding semiconductor 22 whereupon they are transported through the semiconductor 22 to one or other of the electrodes 12, 14 depending on their polarity. Direct transfer of the photo-generated charge carriers may be achieved by providing an electronic coupling between the particles 24 and the matrix semiconductor 22, as is described in more detail below with reference to FIG. 2. Indirect transfer of the photo-generated charge carriers may be achieved by providing an optical coupling between the particles 24 and the matrix semiconductor 22, as is described in more detail below with reference to FIG. 3.

Accordingly, it may be said that the particles 24 have the function of charge carrier generation while the embedding semiconductor 22 provides the function of charge carrier transport to the electrodes 12, 14. It is noted however that the embedding semiconductor material 22 may also generate charge carriers in response to the absorption of photons and these are also transported to the respective electrode 12, 14 by the semiconductor material 22. Typically, the embedding matrix 22 and the particles 24 generate charge carriers in different bands of the electromagnetic spectrum depending on the semiconductor material from which they are formed.

In preferred embodiments, the embedding semiconductor 22 is a perovskite, for example a organometallic halide perovskite, although any semiconductor may alternatively be used. It is preferred to use a semiconductor with relatively good charge carrier transport characteristics. It is also preferred to use a semiconductor that absorbs photons in a spectral range that is complementary to the spectral range in which the particles 24 absorb photons. This improves the efficiency of the device 10 by allowing the absorption of photons across a wider spectral range than is possible with a single semiconductor or semiconductors with matching or significantly overlapping absorption ranges.

The semiconductor particles 24 are preferably nanoparticles, e.g. quantum dots. In preferred embodiments the particles 24 are formed from silicon, although any semiconductor may alternatively be used.

In the present context, the term "nanoparticle" refers to a particle that has at least one dimension in the nanometer range, typically a size range from about 0.1 nm to about 1000 nm, more typically 1 nm to 100 nm. In the case of a nanoparticle that exhibits size dependent properties associated with quantum confinement, the size of the nanoparticle can refer to a quantum-confined physical dimension of the nanoparticle.

Figure 2:
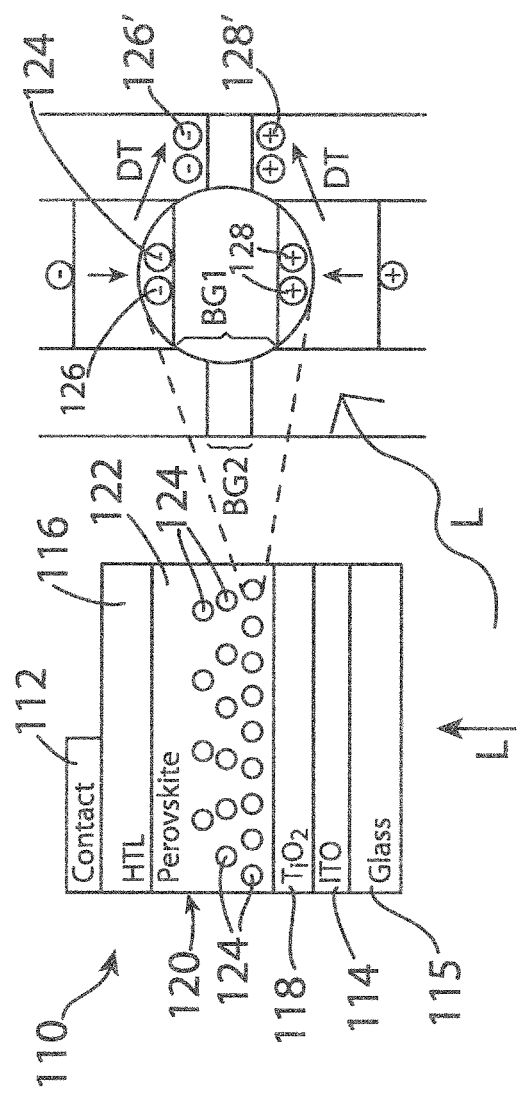
FIG. 2 is a schematic view of an alternative photovoltaic device embodying the present invention; and, the device including first and second semiconductors that are electronically coupled with one another.

Referring now to FIG. 2 of the drawings, there is shown, generally indicated as 110, a photovoltaic device embodying the invention in which like numerals are used to denote like parts and to which the same or similar description applies as for FIG. 1 unless otherwise indicated as would be apparent to a skilled person. The device 110 comprises a photoactive body 120 between electrodes 112, 114, with an optional hole transport layer (HTL) 116 between the body 120 and the electrode 112, and an optional electrode transport layer (ETL) 118 between the body 120 and the electrode 114, which is for example formed from titanium dioxide. In this example, the electrode 112 is formed from gold and the electrode 114 is formed from indium-tin oxide (ITO), although other materials may alternatively be used. The electrode 114 is provided on a transparent substrate 115 of (typically) glass. It is assumed in this example that, in use, light is incident on the device 110 from below (as viewed in FIG. 2) as indicated by arrow L. In this example the embedding semiconductor 122 is organometallic halide perovskite and the embedded particles 124 are silicon quantum dots.

In the example of FIG. 2, the particles 124 are electronically coupled with the embedding semiconductor material 122. The electronic coupling causes the direct transfer of charge carriers, which are shown in FIG. 2 as electrons 126 and holes 128, from the particles 124 to the embedding semiconductor 122, as illustrated by arrows DT and by the transferred electrons 126' and holes 128'. The electronic coupling is effected by selecting the respective semiconductor materials for the matrix 122 and the particles 124 so that a type I heterojunction is created at the interface between the matrix 122 and the particles 124 (this involves selecting the respective semiconductor materials with respective bandgaps that align to create the desired type I heterojunction). The result is a nested, or straddled, bandgap alignment at the interface between the matrix 122 and the particles 124, the bandgap BG1 of the embedding semiconductor 122 being smaller than and located within the bandgap BG2 of the respective particle 124. In use, photo-generated charge carriers 126, 128 in the conduction band of the semiconductor material that forms the particles 124 transfer to the conduction band of the surrounding semiconductor material 122 of the embedding matrix (which has a lower energy level because of the nested bandgap alignment). The transferred charge carriers 126',128' are separated in the embedding semiconductor 122 and transported by the embedding semiconductor 122 to the first electrode 112 (in the case of positive charge carriers, or holes) or to the second electrode 114 (in the case of negative charge carriers, or electrons). The separation and transport of the charge carriers 126',128' may be effected by the electric field inherent in the body 120.

In preferred embodiments, the particles 124 have a hydrogen facilitated silicon surface which, amongst other things, facilitates the transfer of charger carriers to the embedding material 122.

It is noted that the photo-generated charge carriers 126, 128 in the particles 124 may not transfer to the embedding semiconductor 122 simultaneously and that some of the charge carriers 126, 128 may recombine in the particle 124 before they can transfer. It will be understood that such events may be affected by the materials selected as one or both of the embedding material 122 and particles 124. It is preferred to select a material with a relatively low charge carrier recombination rate for the particles 124.

Figure 3:
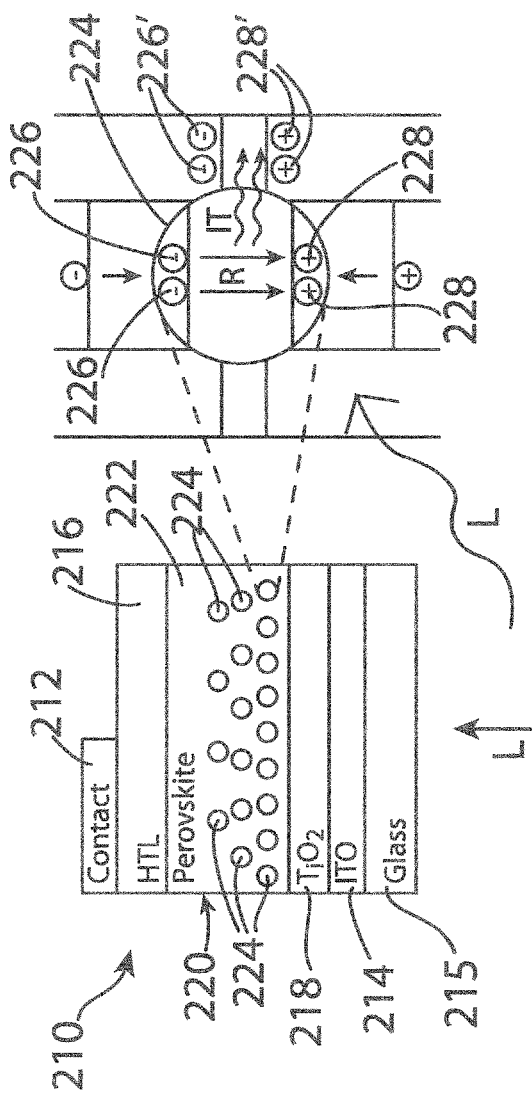
FIG. 3 is a schematic view of a further alternative photovoltaic device embodying the present invention, the device including first and second semiconductors that are optically coupled with one another.

Referring now to FIG. 3 of the drawings, there is shown, generally indicated as 210, a photovoltaic device embodying the invention in which like numerals are used to denote like parts and to which the same or similar description applies as for FIG. 1 unless otherwise indicated as would be apparent to a skilled person. The device 210 comprises a photoactive body 220 between electrodes 212, 114, with an optional hole transport layer (HTL) 216 between the body 220 and the electrode 212, and an optional electrode transport layer (ETL) 218 between the body 220 and the electrode 214, which is for example formed from titanium dioxide. In this example, the electrode 212 is formed from gold and the electrode 214 is formed from indium-tin oxide (ITO), although other materials may alternatively be used. The electrode 214 is provided on a transparent substrate 215 of (typically) glass. It is assumed in this example that, in use, light is incident on the device 210 from below (as viewed in FIG. 3) as indicated by arrow L. In this example the embedding semiconductor 222 is organometallic halide perovskite and the embedded particles 224 are silicon quantum dots.

In the example of FIG. 3, the particles 224 are optically coupled with the embedding semiconductor material 222. The optical coupling causes indirect transfer of charge carriers, which are shown in FIG. 2 as electrons 226 and holes 228, from the particles 224 to the embedding semiconductor 222, as illustrated by arrows IT (which represent the transmission of photons) and by the electrons 226' and holes 228'. In use, pairs of photo-generated electrons 226 and holes 228 in the conduction band of the semiconductor material that forms the particles 224 recombine (illustrated by arrows marked R) in the respective particle 224 to produce corresponding photons IT. The photons IT are transmitted into the surrounding embedding semiconductor 222 whereupon they are absorbed by the embedding semiconductor material 222 to generate corresponding electron-hole pairs 226',228'. This may be said to be an indirect transfer of charge carriers in that the charge carriers 226, 228 generated in the particles 224 cause corresponding charge carriers 226',228' to be generated in the embedding semiconductor 222 by the indirect, or intermediate, mechanism of photon generation and absorption.

To facilitate the optical coupling and in particular the recombination of electron-hole pairs 226, 228 in the particles 224, the particles 224 may be processed and/or configured to promote recombination and/or to inhibit direct transfer of the charge carriers 226, 228 out of the particle 224. This may be achieved in any conventional manner. For example a semiconductor material may be selected for the particles 224 that has a relatively high recombination rate. Alternatively or in addition, chemical modification of the particles 224 may be performed, e.g. involving surface engineering to create or manipulate a chemical monolayer around the particle 224, or to create a shell (typically comprising multiple monolayers) around the particle 224 that tends to electrically insulate the particle and so inhibit carrier transfer. Chemical modification may involve changing the chemical properties to increase likelihood of recombination. In preferred embodiments, the particles 224 have an oxygen based termination, e.g. an oxide layer around the particles 224, that inhibits the direct transfer of charge carriers out of the particles 224.

Although not essential for optically coupled embodiments, it is preferred to select the respective semiconductor materials for the matrix 222 and the particles 224 so that a type I heterojunction is created at the interface between the matrix 222 and the particles 224. This creates a nested, or straddled, bandgap alignment at the interface between the matrix 222 and the particles 224, the bandgap BG1 of the embedding semiconductor 222 being smaller than and located within the bandgap BG2 of the respective particle 224. This facilitates the indirect charge carrier transfer process.

The indirectly transferred charge carriers 226',228' are separated in the embedding semiconductor 222 and transported by the embedding semiconductor 222 to the first electrode 212 (in the case of positive charge carriers, or holes) or to the second electrode 214 (in the case of negative charge carriers, or electrons). The separation and transport of the charge carriers 226',228' may be effected by the electric field inherent in the body 220.

By way of example, to manufacture the devices 110, 210 a film of indium-tin oxide (ITO) approximately 100 nm thick is deposited on the glass substrate 115, 215 to provide the electrode 114, 214. The optional electrode transport layer (ETL) 118, 218 may be formed by depositing a TiO$_2$ thin film approximately 100 nm thick onto the electrode 114, 214 followed by a spray coating TiO$_2$ nanoparticles of approximately 25-100 nm diameter. Next a solution of organic halide perovskite with silicon quantum dots may be spray coated to form a photoactive layer approximately 300 nm thick. The HTL 116, 216 may be sprayed onto the photoactive body 20 or deposited in any other conventional manner. A patterned gold layer approximately 100 nm is then deposited to create the electrode 112, 212. It will be understood that the above sizes, thickness and materials are provided by way of example and are not limiting to the invention as would be apparent to a skilled person. Furthermore any other convenient manufacturing techniques may be used as desired including for example solution processing, co-deposition, co-spraying or any other simultaneous deposition process for any one or both semiconductor materials, transport layers or electrodes (e.g. plasma, evaporation, sputtering etc.).

The particles 124, 224 may be substantially uniformly distributed in the embedding matrix 122, 222. Alternatively, the particles 124, 224 may be distributed with a density that is relatively high adjacent one electrode (electrode 114, 214 in this example) and decreases in the direction L of the irradiation. In any event the (spatial) distribution of the particles 124, 224 should be such that the particles 124, 224 do not prevent charge carriers in the embedding material 122, 222 from being transported to the electrodes 112, 212, 114, 214, i.e. the particles 124, 224 should not form a barrier in the embedding material 122, 222 that prevents charge carriers from reaching the electrodes. The optimization of the concentration and density gradients of the embedded particles may depend on the absorption coefficient of the two semiconductor materials as well as on their complementary absorption ranges. The density of the embedded particles may also depend on the fabrication methodology as in some cases the concentration of the embedded material might be limited by the need to preserve the structural integrity of the embedding material.

The particles 24, 124, 224 are typically 1-50 nm, preferably 1-5 nm, in their primary (usually largest) dimension, e.g. diameter, width or length depending on the shape of the particle. In the examples of FIGS. 2 and 3 it is assumed by way of example that the particles 124, 224 are approximately 2-3 nm in diameter in the case where they are quantum dots or other regularly shaped particle, or may comprise similarly sized but differently shaped nanoparticles, e.g. nanowires approximately 2-3 nm in length.

In typical embodiments, the particles 24, 124, 224 are distributed such that the inter-particle spacing is 1-50 nm, more typically 5-50 nm. The particles 24, 124, 224 are typically make up less than 50% volume of the photoactive body 20, 120, 220.

In electronically coupled embodiments, e.g. the device 110 of FIG. 2, the particles 124 may comprise hydrogen-terminated silicon quantum dots or other nanoparticles, which may for example be provided in solution with the perovskite, or other semiconductor material, before being deposited to form the photoactive body. For optically coupled embodiments, e.g. the device 220 of FIG. 3, the hydrogen terminated silicon quantum dots (or other nanoparticles) may first be subjected to a plasma-liquid surface engineering process to replace the H-termination with oxygen based terminations. Also, for optically coupled embodiments, the embedded semiconductor material should preferably exhibit very high emission quantum yields.

More generally, for electronically coupled embodiments, the particles may have a surface termination, for example a hydrogen terminated surface, that facilitates transfer of positive and negative charge carriers the particles to the embedding material. For optically coupled embodiments, the particles may have a surface termination, for example an oxygen terminated surface, that prevents or at least impedes direct transfer of the positive and negative charge carriers from the respective particle to the embedding semiconductor material.

It will be understood that embodiments of the invention may use different semiconductor materials than those described herein. It is preferred that semiconductor materials are selected to form a type-I heterojunction between the particles 24, 124, 224 and the embedding material 22, 122, 222. In general, the embedding semiconductor should preferably be a material with relatively good charge carrier transport properties and relatively low charge carrier recombination rates. The embedded material should preferably exhibit highly efficient charge carrier generation. Preferably, the embedding and embedded semiconductor materials have complementary absorption ranges with respect to the solar spectrum e.g. such that the embedding matrix absorbs photons in a different spectral range than the particles.

As indicated above, the two different types of charge carriers (electrons and holes) are transported to a respective electrode 12, 112, 212, 14, 114, 214. This may be effected in a number of ways. Most commonly, the electric field that develops inherently in the body 20, 120, 220 of the device 10, 110, 210 (e.g. because of the potential difference between the electrodes) causes charge separation automatically. Alternatively or in addition, the semiconductor material 22, 122, 222 can be chemically configured to cause or encourage the different charge carrier types towards one electrode or the other, for example such that electrons and holes are spatially separated within the embedding material so that they exhibit a very low chance of recombination and so that good transport to the electrodes is provided. Therefore, in some embodiments, charge carrier dissociation in the embedding material 22, 122, 222 and improved transport takes place due to the chemical composition of the embedding material as a result of preferential localization of charge carriers, i.e. with electrons preferentially distributed and transported over given sites and holes preferentially distributed transported over other sites (this may be referred to as "segregated transport"). Alternatively, or in addition, charge carrier dissociation and improved transport may take place due to the indirect bandgap of the embedding material 22, 122, 222 that reduces charge carrier recombination rates and energetically separates the charge carriers.

In typical embodiments, the embedding material 22, 122, 222 has a relatively low charge carrier density which helps to develop a relatively high internal electric field. In any event, the charge carrier density in the embedding material should be sufficiently low to allow an electric field to develop across the body 20, 120, 220 between the electrodes.

In some embodiments, the embedded material 22, 122, 222 may comprise nanoparticles with different shell thicknesses, e.g. from monolayer surface passivation to a shell of a few to 10s of nanometres.

It will be understood that in any embodiment, the embedding material 22, 122, 222 typically also absorbs photons from the irradiation and contributes to the generation of charge carriers of both types. Such charge carriers are thus generated by and transported by the embedding material itself. Advantageously, the embedding material is a semiconductor that absorbs photons in a different (e.g. overlapping, adjacent or distinct) spectral range than the semiconductor material from which the particles 24, 124, 224 are made.

As described above, the particles 24, 124, 224 do not perform the function of transporting charge carriers of either type to either of the electrodes, and do not therefore have to form a percolating or other charge carrier transport network for transporting charge carriers to either electrode. As such, the physical requirements, e.g. relating to particle spacing and proximity to the electrodes, that would otherwise be required to create a charge transport network do not apply to the particles 24, 124, 224. This means that one or more characteristics of the photoactive body 20, 120, 220, e.g. the ratio of embedded material to the embedding material, the location, spacing and/or density of the embedded particles, can be chosen or manipulated with the aim of optimizing the performance of the device 10, 110, 210 and without having to take into account the other requirements.

In embodiments where optical coupling is used, because the particles 24, 124, 224 are embedded in the material 22, 122, 222 that absorbs the photons generated by the particles 24, 124, 224, the photons are absorbed isotropically around the particles 24, 124, 224. This is in contrast to conventional downconverters in which the optical converters are used outside the active/absorbing layer so that about half of the photon emission is lost.

Optionally, the nanoparticles 24, 124, 224, or quantum dots, are of a type that exhibits multiple charge carrier generation or multi-exciton generation.

In typical embodiments, the particles and embedding material are formed from different semiconductor materials although it is possible to use the same semiconductor for each. Embodiments in which the embedding material and the particles are formed from the same semiconductor material may still form a type I junction at their interface (i.e. a type I homojunction rather than a type I heterojunction) because, in cases where the particles are quantum confined, quantum confinement may cause the bandgap of the embedding particle material to increase so that the quantum confined nanoparticles would have wider bandgap aligning in type-I with the bandgap of embedding material.

The invention is not limited to the embodiment(s) described herein but can be amended or modified without departing from the scope of the present invention.

The invention claimed is:

1. A photovoltaic device comprising:
a first electrode;
a second electrode;
a photoactive body comprised of a first semiconductor material located between the first and second electrodes and being in contact with each of said first and second electrodes, said first semiconductor material being configured to transport positive charge carriers to one of said first and second electrodes and to transport negative charge carriers to the other of said first and second electrodes; and
a plurality of particles of semiconductor material embedded in said first semiconductor material, the particles being responsive to the absorption of light to generate positive and negative charge carriers, said particles being spatially distributed in said first semiconductor material, said particles having a spatial distribution within said first semiconductor material that is configured to prevent the particles from providing paths by which the positive and negative charge carriers can be transported by said particles to either of said first and second electrodes such that collectively said particles do not form a charge carrier transport network in said photoactive body and are not collectively capable of transporting either said positive charge carriers or said negative charge carriers to either of said first and second electrodes;

wherein said particles and said first semiconductor material are configured to form a type 1 heterojunction or a type 1 homojunction between the particles and the first semiconductor material, wherein a band gap of the first semiconductor material is smaller than a band gap of said particles to cause said generated positive and negative charge carriers to transfer from said particles to said first semiconductor material; or wherein said particles are configured to cause recombination of said generated positive and negative charge carriers in said particles to produce photons, said particles being configured to optically couple with said first semiconductor material to cause said photons to be transmitted to said first semiconductor material, said first semiconductor material being configured to absorb said photons and to generate corresponding positive and negative charge carriers in said first semiconductor material.

2. The device of claim 1, wherein said particles are spatially distributed in said first semiconductor material such that collectively said particles do not prevent charge carriers in said first semiconductor material from being transported by said first semiconductor material to the respective electrode.

3. The device of claim 1, wherein there is a nested, or straddled, bandgap alignment at the interface between the particles and the first semiconductor material.

4. The device of claim 3, wherein the bandgap of the first semiconductor is smaller than and located within the bandgap of the respective particle.

5. The device of claim 1, wherein said particles are nanoparticles.

6. The device of claim 1, wherein said particles are quantum dots.

7. The device of claim 1, wherein said particles are formed from silicon.

8. The device of claim 1, wherein said first semiconductor material is a perovskite.

9. The device of claim 8, wherein said first semiconductor material is an organometallic halide perovskite.

10. The device of claim 1 in which a selective contact layer is provided between said photoactive layer and either or both of said first and second electrodes.

11. The device of claim 10, wherein said selective contact layer is a hole transport layer or an electron transport layer.

12. The device of claim 1, wherein said particles are formed from a second semiconductor material different from said first semiconductor material.

13. A photovoltaic device comprising:
a first electrode;
a second electrode;
a photoactive body comprised of a first semiconductor material located between the first and second electrodes and being in contact with each of said first and second electrodes, said first semiconductor material being configured to transport positive charge carriers to one of said first and second electrodes and to transport negative charge carriers to the other of said first and second electrodes; and
a plurality of particles of semiconductor material embedded in said first semiconductor material, the particles being responsive to the absorption of light to generate positive and negative charge carriers, said particles being spatially distributed in said first semiconductor material, said particles having a spatial distribution within said first semiconductor material that is configured to prevent the particles from providing paths by which the positive and negative charge carriers can be transported by said particles to either of said first and second electrodes such that collectively said particles do not form a charge carrier transport network in said photoactive body and are not collectively capable of transporting either said positive charge carriers or said negative charge carriers to either of said first and second electrodes;

wherein said particles and said first semiconductor material are configured to form a type 1 heterojunction or a type 1 homojunction between the particles and the first semiconductor material, wherein a bandgap of the first semiconductor material is smaller than a bandgap of said particles.

14. The device of claim 13 wherein said particles are electronically coupled to said first semiconductor material to allow direct transfer of said positive and negative charge carriers from the respective particle to the first semiconductor material.

15. The device of claim 14 wherein said particles have a surface termination that facilitates direct transfer of said positive and negative charge carriers from the respective particle to the first semiconductor material.

16. A photovoltaic device comprising:
a first electrode;
a second electrode;
a photoactive body comprised of a first semiconductor material located between the first and second electrodes and being in contact with said first and second electrodes, said first semiconductor material being configured to transport positive charge carriers to one of said first and second electrodes and to transport negative charge carriers to the other of said first and second electrodes; and
a plurality of particles of semiconductor material embedded in said first semiconductor material, the particles being responsive to the absorption of light to generate positive and negative charge carriers, said particles being spatially distributed in said first semiconductor material said particles having a spatial distribution within said first semiconductor material that is configured to prevent the particles from providing paths by which the positive and negative charge carriers can be transported by said particles to either of said first and second electrodes such that collectively said particles do not form a charge carrier transport network in said photoactive body and are not collectively capable of transporting either said positive charge carriers or said negative charge carriers to either of said first and second electrodes;

wherein said particles are configured to promote recombination of said generated positive and negative charge carriers in said particles to produce photons by either one or both of:
forming said particles from a semiconductor material having a recombination rate that promotes recombination of said generated positive and negative charge carriers in said particles; and
chemically modifying said particles to promotes recombination of said generated positive and negative charge carriers in said particles; and wherein said particles are electrically insulated to inhibit transfer of said positive and negative charge carriers from said particles to said first semiconductor material, whereby said photons generated by recombination of positive and negative charge carriers in said particles are transmitted to said first semiconductor material, said first semiconductor material being configured to absorb said photons and to generate corresponding positive and negative charge carriers in said first semiconductor material.

17. The device of claim 16, wherein said particles have a surface termination that prevents or at least impedes direct transfer of said positive and negative charge carriers from the respective particle to the first semiconductor material.

18. The device of claim 17, wherein said particles have at least one surface monolayer.

19. The device of claim 18, wherein said particles have at least one electrically insulating surface monolayer.

20. The device of claim 16, wherein a type I heterojunction or type I homojunction is formed between said particles and said first semiconductor material, and wherein a band gap of said first semiconductor material is smaller than a bandgap of said particles.

* * * * *